United States Patent [19]

Edmond

[11] Patent Number: 4,966,862
[45] Date of Patent: Oct. 30, 1990

[54] METHOD OF PRODUCTION OF LIGHT EMITTING DIODES

[75] Inventor: John A. Edmond, Apex, N.C.

[73] Assignee: Cree Research, Inc., Durham, N.C.

[21] Appl. No.: 400,279

[22] Filed: Aug. 28, 1989

[51] Int. Cl.$^5$ .......................................... H01L 31/0312
[52] U.S. Cl. .................................... 437/100; 437/226; 437/181; 437/905; 437/906
[58] Field of Search ............... 437/100, 226, 227, 905, 437/906

[56] References Cited

U.S. PATENT DOCUMENTS

| | | |
|---|---|---|
| 3,611,064 | 10/1971 | Hall . |
| 3,805,376 | 4/1974 | D'Asaro et al. . |
| 3,871,016 | 3/1975 | Debesis . |
| 3,889,286 | 10/1975 | Debesis . |
| 3,909,929 | 10/1975 | Debesis . |
| 3,964,157 | 6/1976 | Kuhn et al. . |
| 3,991,339 | 11/1976 | Lockwood et al. . |
| 4,122,486 | 10/1978 | Ono et al. . |
| 4,396,929 | 8/1983 | Ohki et al. . |
| 4,476,620 | 10/1984 | Ohki et al. . |
| 4,531,142 | 7/1985 | Weyrich et al. . |
| 4,604,161 | 9/1986 | Araghi ................................ 437/226 |
| 4,610,079 | 9/1986 | Abe ..................................... 437/227 |
| 4,814,296 | 3/1989 | Jedlicka ............................. 437/226 |
| 4,822,755 | 4/1989 | Hawkins ............................ 437/227 |

FOREIGN PATENT DOCUMENTS

| | | | |
|---|---|---|---|
| 0019384 | 2/1979 | Japan ................................ 437/906 |
| 0216338 | 9/1986 | Japan ................................ 437/226 |

OTHER PUBLICATIONS

T. Nakata, K. Koga, Y. Matsushita, Y. Ueda and T. Niina; Single Crystal Growth of 6H–SiC by a Vacuum Sublimation Method, and Blue LEDs; Semiconductor Res. Cent., Sanyo Elec. Co., Ltd., 1-18-13 Hashiridani, Hirakata, Osaka 573 J.

G. Ziegler, P. Lanig, D. Theis and C. Weyrich; Single Crystal Growth of SiC Substrate Material for Blue Light Emitting Diodes; IEEE Trans. on Elec. Dev., vol. Ed-30, No. 4, Apr. 1983.

V. Dmitriev, L. Kogan, Ya. Morozenko, I. Popov, V. Rodkin and V. Cheinokov; Blue-Emitting Displays from Silicon Carbide Grown by Containerless Liquid--Phase Epitaxy; Sov. Tech. Phys. Lett. 12(4), Apr. 1986.

W. Münch and W. Kürzinger; Silicon Carbide Blue-E-

(List continued on next page.)

Primary Examiner—Brian E. Hearn
Assistant Examiner—Linda J. Fleck
Attorney, Agent, or Firm—Bell, Seltzer, Park & Gibson

[57] ABSTRACT

The invention is a method for preparing a plurality of light emitting diodes on a single substrate of a semiconductor material. The method is used for structures where the substrate includes an epitaxial layer of the same semiconductor material that in turn comprises layers of p-type and n-type material that define a p-n junction therebetween. The epitaxial layer and the substrate are etched in a predetermined pattern to define individual diode precursors, and deeply enough to form mesas in the epitaxial layer that delineate the p-n junctions in each diode precursor from one another. The substrate is then grooved from the side of the epitaxial layer and between the mesas to a predetermined depth to define side portions of diode precursors in the substrate while retaining enough of the substrate beneath the grooves to maintain its mechanical stability. Ohmic contacts are added to the epitaxial layer and to the substrate and a layer of insulating material is formed on the diode precursor. The insulating layer covers the portions of the epitaxial layer that are not covered by the ohmic contact, any portions of the one surface of the substrate adjacent the mesas, and the side portions of the substrate. As a result, the junction and the side portions of the substrate of each diode are insulated from electrical contact other than through the ohmic contacts. When the diodes are separated they can be conventionally mounted with the junction side down in a conductive epoxy without concern that the epoxy will short circuit the resulting diode.

16 Claims, 2 Drawing Sheets

OTHER PUBLICATIONS mitting Diodes Produced by Liquid-Phase Epitaxy; Solid-State Electronics vol. 21, pp. 1129–1132; 1978.

L. Hoffmann, G. Ziegler, D. Theis, C. Weyrich; Silicon Carbide Blue Light Emitting Diodes with Improved External Quantum Efficiency; J. Appl. Phys. 53(10), Oct. 1982.

Siemens; LDB5410; Blue T1 ¾ LED Lamp; Preliminary Data Sheet.

B. Vishnevskaya, V. Dmitriev, I. Kovalenko, L. Kogan, Ya. Morozenko, V. Rodkin, A. Syrkin, B. Tsarenkov, V. Cheinokov; Silicon Carbide (6H) Diodes Emitting Blue Light; Sov. Phys. Semicond. 22(4), Apr. 1988.

E. Violin and Yu. Tairov (1933); Light-Emitting Devices Based on Silicon Carbide.

W. Münch; Silicon Carbide Technology for Blue-Emitting Diodes; Journal of Electronic Materials, vol. 6, No. 4, 1977.

METHOD OF PRODUCTION OF LIGHT EMITTING DIODES

FIELD OF THE INVENTION

The present invention relates to a method of producing light emitting diodes and in particular relates to a method of producing a plurality of blue light emitting diodes from a single substrate or wafer of silicon carbide, and to the light emitting diodes which result. This application is related to co-pending application Ser. No. 07/284,293, Filed Dec. 14, 1988 to Edmond for "Blue Light Emitting Diode Formed In Silicon Carbide," which is incorporated entirely herein by reference.

BACKGROUND OF THE INVENTION

Light emitting diodes, commonly referred to as "LED's", are semiconductor devices which convert electrical energy into light. As is known to those familiar with semiconducting materials, diodes formed from certain types of materials will produce energy in the form of light when current passes across the p-n junction in such a semiconducting diode. When current passes across a diode's junction, electronic events occur that are referred to as "recombinations," and in which electrons in the semiconductor combine with vacant energy level positions, referred to as "holes," in the semiconductor. These recombination events are typically accompanied by the movement of an electron from a higher energy level to a lower one in the semiconductor material. The energy difference between the energy levels determines the amount of energy that is be given off. When the energy is given off as light (i.e. as a photon), the difference in energy levels results in a particular corresponding wavelength of light being emitted. Because the positions of various available energy levels are a fundamental characteristic of any particular element or compound, the color of light that can be produced by an LED is primarily determined by the semiconductor material in which the recombination is taking place. Additionally, the presence in the semiconductor material of added dopant ions, which are referred to as either "donors" because they provide extra electrons, or as "acceptors" because they provide additional holes, results in the presence of additional energy levels in the semiconductor material between which electrons can move. This in turn provides different amounts of energy that are given off by the available transitions and provides other characteristic wavelengths of light energy given off by these additionally available transitions.

Because of this relationship between energy and wavelength—which in the visible portion of the electromagnetic spectrum represents the color of the light—blue light can only be produced by a semiconductor material having a band gap larger than 2.6 electron volts (eV). The "band gap" refers to the basic energy transition in a semiconductor between a higher or "conduction" band energy level and a more regularly populated lower or "valence" energy band level. For example, materials such as gallium phosphide (GaP) or gallium arsenide (GaAs) cannot produce blue light because the band gaps are on the order of about 2.26 eV or less. Instead, a blue light emitting solid state diode must be formed from a semiconductor with a relatively large band gap such as gallium nitride (GaN), zinc sulfide (ZnS), zinc selenide (ZnSe) and alpha silicon carbide (also characterized as "hexagonal" or "6H silicon carbide," among other designations. Accordingly, a number of investigators have attempted to produce blue light emitting diodes using alpha silicon carbide.

Nevertheless, silicon carbide has not presently reached the full commercial position in the manufacture of electronic devices, including light emitting diodes, that would be expected on the basis of its otherwise excellent semiconductor properties and its potential for producing blue LED's. For example, in addition to its wide band gap, silicon carbide has a high thermal conductivity, a high saturated electron drift velocity, and a high breakdown electric field. All of these are desirable properties in semiconductor devices including LED's. The failure of silicon carbide LED's to reach commercial success appears to be the result of the difficulties encountered in working with silicon carbide. In particular, high process temperatures are required, good starting materials are typically difficult to obtain, particular doping techniques have heretofore been difficult to accomplish, and perhaps most importantly, silicon carbide crystallizes in over 150 polytypes, many of which are separated by very small thermodynamic differences.

Accordingly, the goal of controlling the growth of single crystals or monocrystalline thin films of silicon carbide which are of sufficient quality to make electronic devices such as diodes practical, useful, and commercially viable, has eluded researchers in spite of years of diligent effort, much of which is reflected in both the patent and nonpatent literature.

Recently, however, a number of developments have been accomplished which offer the ability to grow large single crystals of device quality silicon carbide, to grow thin films of device quality silicon carbide, to successfully etch silicon carbide, and to introduce dopants into silicon carbide, all steps that are typically required in the manufacture of LED's and other electronic devices. These developments are the subject of co-pending patent applications that have been assigned or exclusively licensed to the common assignee of the present invention and which are incorporated entirely herein by reference. In addition to the application mentioned earlier, these include Davis et al, "Growth of Beta-SiC Thins Films and Semiconductor Devices Fabricated Thereon," Ser. No. 113,921, Filed Oct. 26, 1987; Davis et al, "Homoepitaxial Growth of Alpha-SiC Thin Films and Semiconductor Devices Fabricated Thereon," Ser. No. 113,573, Filed Oct. 26, 1987; Davis et al, "Sublimation of Silicon Carbide to Produce Large, Device Quality Single Crystals of Silicon Carbide," Ser. No. 113,565, Filed Oct. 26, 1987; Palmour, "Dry Etching of Silicon Carbide, Ser. No. 116,467, filed Nov. 3, 1989; and Edmond et al, "Implantation and Electrical Activation of Dopants Into Monocrystalline Silicon Carbide," Ser. No. 113,561, Filed Oct. 26, 1987.

As set forth in some detail in the Edmond '293 application, a number of different doping techniques and basic device structures are used to produce light of approximately 424–428 nanometers (nm), light of approximately 455–460 nm, and light of approximately 465–470 nm in diodes formed from silicon carbide. Although describing the visible colors of these wavelengths is somewhat of a generalization, the 424–428 nm light has a characteristic violet color, the 455–460 nm transition gives a more medium blue color, and the 465–470 nm transition gives a characteristic light blue color.

As further set forth in the Edmond '293 application, one usual goal in producing LED's is to obtain as much emitted light as possible. This is addressed by a number of techniques familiar to those in the art, some of which are: injecting as much current as possible across the p-n junction; having the greatest possible dopant population in the emitting layer; obtaining the greatest possible efficiency in producing recombination events; and using a physical structure, including the optical characteristics of the semiconductor material itself that enhances the visible light obtained from the diode. With regard to this last characteristic, a transparent semiconductor material will often be the most desireable.

Using these considerations, one of the more desirable and efficient transitions in silicon carbide is that between an impurity band of nitrogen (donor) below the conduction band and an impurity band of aluminum (acceptor) above the valence band. This transition is especially favorable when combined with a physical structure that encourages most of the current passing across the junction to be p-type current; i.e. the flow of holes across the junction and into the n-type material. As is known to those familiar with silicon carbide, the donor band of nitrogen is approximately 0.075 eV below the conduction band of silicon carbide, while the acceptor band of aluminum is approximately 0.22 eV above the valence band. The resulting transition is on the order of about 2.62 eV and emits a photon having a wavelength between about 465 nm and 470 nm and with a characteristic blue color.

Furthermore, in order to produce this transition, one of the portions of the diode must be doped with both donor and acceptor dopants, but with one dopant predominating over the other to give a distinct p or n electrical characteristic to the material This technique is referred to as "compensation," and the resulting portion of semiconductor material is referred to as being "compensated." For example, in order to use hole current to produce blue light in a silicon carbide LED—another favorable technique in particular applications—the portion of the diode which is n-type must be doped with both donor (often nitrogen) and acceptor (often aluminum) dopants, with the nitrogen predominating, to give an overall n-type characteristic even with the acceptor atoms present.

Certain problems arise, however, in attempting to form LED's that have these characteristics. For example, where a p-type substrate is desirably or necessarily used (depending upon the manufacturing technique used or the device that may be desired) it will have a rather high resistivity. This results from the well-known facts that the mobility of holes is one-sixth that of electrons, and that typically less than two percent of acceptor atoms are ionized (i.e. able to act as charge carriers) at room temperature. These characteristics result in a higher resistance in forward bias for p-substrate diodes, which is a less desirable trait for a diode.

One attempted manner of addressing the resistivity problem is to increase the hole concentration in the p-type substrate. The addition of the extra dopant required to increase the hole concentration, however, tends to make the crystal opaque and reduces the emitted light that can be observed. Conversely, by keeping the dopant concentration lower, the crystal will be more transparent, but at the cost of an undesirably high resistivity.

The problems associated with high resistivity substrates can also be addressed mechanically, for example by avoiding using the substrate portion as a conductor in the diode. U.S. Pat. No. 4,531,142 discusses such a mechanical technique. This is an extremely difficult manufacturing technique, however, as reflected in the low availability and high cost of such diodes. Another solution is to use a relatively large ohmic contact to the p+ layer so as to increase the current across the junction. The practical effect, however, is to block light from being emitted from the p+ layer by the presence of the ohmic contact.

In contrast the co-pending and incorporated Edmond '293 application teaches a number of solutions to these problems and in particular discusses the successful use of chemical vapor deposition as set forth in the similarly copending and incorporated Davis '573 application in order to successfully produce such diodes.

Once such diodes are shown to be practical and efficient, however, interest and need arises for having them manufactured on a commercial scale. For example, in one of the most effective LED's described by the Edmond '293 application, the diode consists of an n-type substrate, an n-compensated epitaxial layer and a p+-epitaxial layer. Under a forward bias, hole current injected from the p+ to the n-compensated layer is the predominating current in this diode. As discussed earlier and in the Edmond '293 application, the generally higher resistivity of the top p+ layer makes it more difficult to get an appropriate amount of current spreading, which is exhibited as a corresponding lack of uniformity in the light generated in that layer.

Because the blue light generated by diodes formed of alpha silicon carbide is commercially desirable, however, there exists the additional need for developing a method and structure for commercially producing and packaging such diodes and which will have advantages for other similar diodes as well. As is known to those familiar in the industry, in order to be useful such a diode has to be mounted and it is most useful if such a diode can be conventionally mounted using techniques such a conductive epoxy and reflective cups. Similarly, the nature and position of the ohmic contacts and the crystal structure itself should also be designed for commercial manufacture and the techniques used should avoid damaging the junctions during the manufacturing process. Finally, such a technique should be appropriate for multiple or mass production. To date, appropriate commercial applications of this type are rarely seen in the pertinent art.

SUMMARY OF THE INVENTION

Accordingly, it is an object of the present invention to provide a method for preparing a plurality of light emitting diodes on a single substrate of a semiconductor material in which the resulting diodes can be separated and mechanically fixed to transmit from their substrate side rather than the junction side using otherwise conventional mounting techniques. The method is appropriately used for structures where the substrate includes an epitaxial layer of the same semiconductor material on one surface thereof, and in which the epitaxial layer comprises a layer of p-type material and a layer of n-type material that define a p-n junction therebetween. The method comprises etching the epitaxial layer and the substrate in a predetermined pattern to define individual diode precursors and wherein the etch is deep enough to form mesas in the epitaxial layer that delineate the p-n junctions in each diode precursor from one another. The method further comprises grooving the substrate from the side of the epitaxial layer and between the mesas of the diode precursors to a predetermined depth into the substrate to define side portions of a device precursors in the substrate while retaining enough of the substrate beneath the grooves to maintain its mechanical stability. An ohmic contact is added to the epitaxial layer and a layer of insulating material is formed on the diode precursor. The insulating layer covers the portions of the epitaxial layer that are not covered by the ohmic contact, any portions of the one surface of the substrate adjacent the mesas, and the side portions of the substrate. When a desired ohmic contact is added to the substrate, the result is a diode structure wherein the surface, the junction and the side portions of the substrate of each diode are insulated from electrical contact other than through the ohmic contacts. When the diodes are separated they can be conventionally mounted with the junction side down in a conductive epoxy without concern that the epoxy will short circuit the resulting diode.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENT

Figure 1:
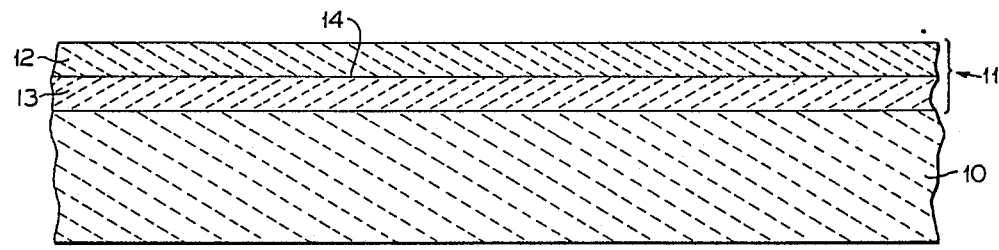
FIGS. 1–5 illustrate a number of the steps of the method of forming the diode of the present invention.

As illustrated in FIGS. 1–5, the invention is a method for preparing a plurality of light emitting diodes on a single substrate of a semiconductor material, which in preferred embodiments is alpha silicon carbide. FIG. 1 shows a silicon carbide substrate 10 upon which an epitaxial layer broadly designated at 11 has been formed. Preferably, the expitaxial layer 11 comprises individual epitaxial layers 12 and 13 which have opposite conductivity types (p or n) from one another and thereby form a p-n junction therebetween which is schematically illustrated at 14. The substrate 10 itself also has a given conductivity type, either p or n for reasons which will become apparent throughout the following description. Although the invention broadly comprises forming the epitaxial layer 11 on the substrate 10, it will be understood that the substrate 10 with the epitaxial layer 11 already thereon can also be considered the starting material for the method of the invention. In the preferred embodiment, the epitaxial layer 10 comprises a wafer of silicon carbide of the type that is conventionally used in the manufacture of multiple semiconductor devices.

As discussed in the background portion of the specification, the ability to successfully produce blue light emitting diodes in silicon carbide has resulted from particular foundational work described in co-pending applications which are either assigned or exclusively licensed to the assignee of the present invention. In particular, the Davis method of chemical vapor deposition of alpha silicon carbide on alpha silicon carbide (application Ser. No. 113,573) is the preferred method of adding the epitaxial layer to the silicon carbide substrate 10. In the Davis method, the step of forming an epitaxial layer of alpha silicon carbide 11 on one surface of the substrate 10 comprises homoepitaxially depositing a film of an alpha silicon carbide polytype 11 on a prepared surface of the alpha silicon carbide substrate 10 wherein the planar surface of the substrate 10 is inclined more than one degree towards one of the <1120> directions. The particulars of this method are described in detail in the Davis '573 application which, as stated earlier, is incorporated entirely herein by reference and which will therefore will not otherwise be described in detail.

Figure 2:
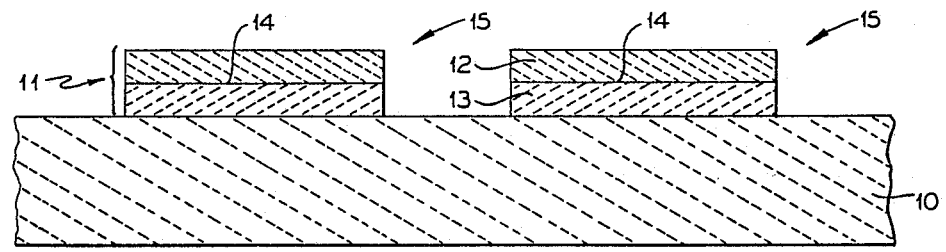
Figure 3:
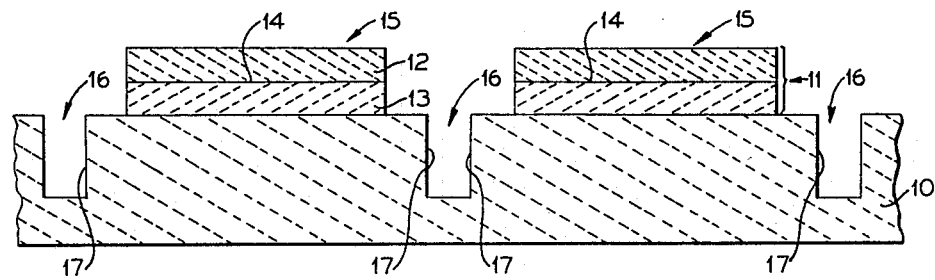
Figure 4:
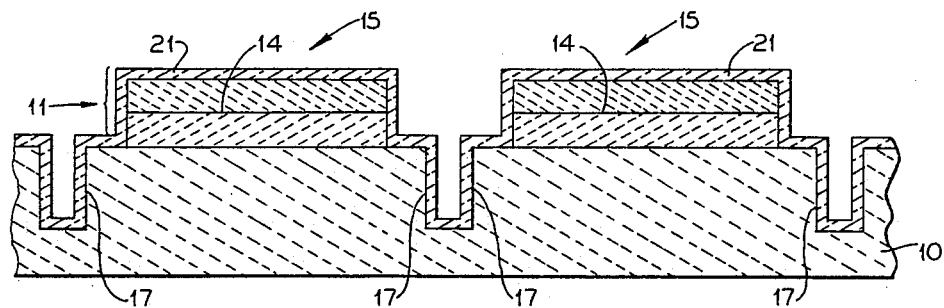

FIG. 2 illustrates the results of the next step in the method of the invention, that of etching the epitaxial layer 11 and the substrate 10 in a predetermined pattern to define individual diode precursors. In a preferred embodiment, the etch is deep enough to form mesas broadly designated at 15 in the epitaxial layer 11 that delineate the p-n junctions 14 in each diode precursor from one another. As illustrated in FIGS. 2–5, the mesa portions 15 partly define the diode precursors so that FIGS. 2, 3 and 4 illustrate two such diode precursors. In a preferred embodiment the mesa structure 15 on the substrate 10 is defined by the border between the substrate 10 and the epitaxial layer 11.

FIG. 3 illustrates that the next step is that of grooving the substrate 10 from the side of the epitaxial layer 11 and between the mesas 15 of the diode precursors to a predetermined depth into the substrate 10. The resulting grooves are broadly designated at 16 and in turn define side portions 17 of the device precursors in the substrate 10. Enough of the substrate 10 is retained beneath the grooves 16 to maintain the mechanical stability of the substrate. As will be described later herein, the depth to which the substrate 10 is grooved also relates to conventional mounting techniques which enhance the value of the method of the present invention and the diodes that result.

Figure 5:
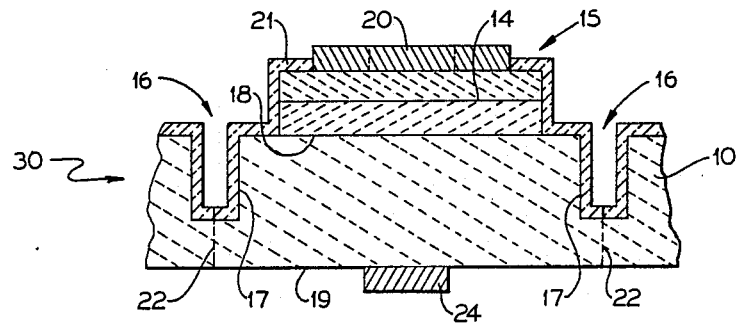

FIGS. 4 and 5 illustrate that the next steps in the method are the additional of an ohmic contact 20 to the epitaxial layer 11 and the formation of a layer of insulating material 21 to the device precursor structure. It will be understood that depending upon the particular techniques selected, either the ohmic contact 20 or the insulating material 21 can be added first followed by the addition of the other. FIG. 4 illustrates a preferred order of steps in which the formation of the layer of insulating material 21 takes place first and shows that when the respective steps are completed the layer 21 covers the portions of the epitaxial layer 11 that are not covered by the ohmic contact (FIG. 5), any portions of the one surface of the substrate 10 adjacent the mesas 15 that are not covered by the epitaxial layer 11, and portions of the side portions 17 of the substrate 10. As a result, the layer 21 insulates the one surface, the junction and the side portions of the substrate of each diode precursor from electrical contact other than through the ohmic contact 21.

In the preferred embodiment of the invention, the grooves are formed using a diamond blade dicing saw and the mesas are etched using the technique described by Palmour in co-pending and incorporated application Ser. No. 116,467.

In the preferred embodiment, the insulating layer 21 is a thermally grown native oxide, and is also referred to as a "passivation" layer for the diode. As FIG. 5 illustrates, the step of adding the ohmic contact 21 to the exposed epitaxial layer 11 comprises removing the oxide layer 21 to expose the epitaxial layer 11 to the ohmic contact, and in a most preferred embodiment comprises selectively etching the oxide layer 21 FIG. 5 also illustrates that another ohmic contact 24 is added to the substrate 10 before individual devices are separated from one another.

FIG. 5 also illustrates that the method can further comprise the step of separating the diode precursors into individual diodes. Preferably, this step comprises cutting the substrate 10 from the side opposite the epitaxial layer 11 and at positions shown as the dotted lines 22 that correspond to the grooves 16. A diamond blade dicing saw is also appropriately used for this step as well. In this manner, cutting the diode precursors into individual diodes proceeds in a manner that avoids mechanical stress upon either the epitaxial layer or the junction. It is understood by those familiar with such devices and techniques that the mechanical stress of cutting a wafer of device precursors into individual devices (also referred to both singularly and plurally as "die") can often have an deleterious effect on the crystal structure of the substrate and the epitaxial layers as well as the integrity of the junctions. The particular technique of the present invention thus advantageously provides a method of forming a plurality of diode precursors on a single wafer while still permitting efficient and careful manufacture of individual diodes from the wafer. FIGS. 3, 4 and 5 also show that the grooves in the wafer are limited to a depth that preserves sufficient substrate material 10 beneath the grooves 16 to maintain the mechanical integrity of the wafer for further processing and handling as an integral wafer.

In preferred embodiments of the invention, the ohmic contact 20 comprises aluminum or an aluminum alloy to which an overlay contact of a noble metal such as platinum, palladium, gold or silver is most preferably added to prevent oxidation of the ohmic contact. Similarly, a wire-bondable overlay contact is preferably added to ohmic contact 24 and is most preferably formed of aluminum, gold, or silver.

Figure 6:
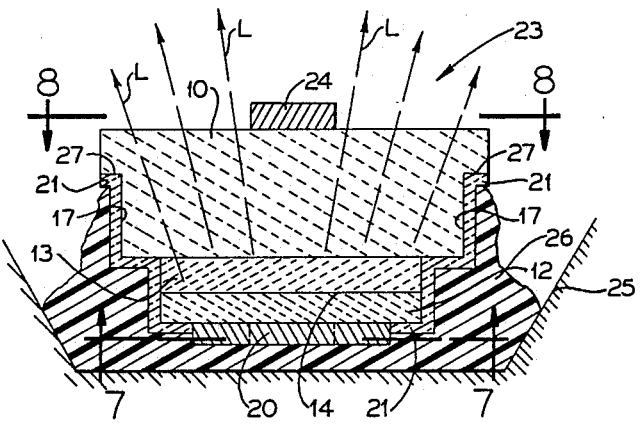
FIG. 6 illustrates the diode of the present invention in a conventional mounting.

Following the mounting of individual diodes in the method to be described hereafter, the resulting overall structure is illustrated in FIG. 6. The light emitting diode is broadly designated at 23 and includes the substrate 10, the epitaxial layer 11, illustrated as individual epitaxial layers 12 and 13, the ohmic contacts 20 and 24, the insulating layer 21 and the junction 14. FIG. 6 illustrates that in the preferred embodiment, the substrate 10 is substantially transparent which permits the diode to emit light through the substrate as indicated by the arrows L. In the preferred embodiment, and for reasons thoroughly discussed the co-pending Edmond '293 application, the substrate 10 comprises n-type alpha silicon carbide, the first epitaxial layer 13 comprises n-type alpha silicon carbide and the second epitaxial layer 12 comprises p-type alpha silicon carbide. Most preferably, the epitaxial layer 12 is a p-type layer of alpha silicon carbide and epitaxial layer 13 is a compensated n-type layer of alpha silicon carbide. As understood by those familiar with silicon carbide and its polytypes, alpha silicon carbide can be selected from the group consisting of the 6H, 4H, and 15R polytypes.

As further illustrated in FIG. 6, in addition to being substantially transparent, the substrate 10 has a dimension small enough between the epitaxial layer and its bottom surface to permit the visible light L to be emitted from the diode device 23 through the substrate 10 even when the epitaxial layer 11 is substantially blocked from emitting light therefrom as is the case with the device illustrated in FIG. 6.

FIG. 6 also illustrates that the device 23 includes an ohmic contact 24 to the substrate 10 for completing a conductive path from the ohmic contact 20 through the epitaxial layers 12 and 13, the junction 14, and the substrate 10 that permits the desired current flow.

FIG. 6 also illustrates another advantage of the invention, namely the ability to center both ohmic contacts 20 and 24 relative to the substrate and the epitaxial layer. As stated earlier and as known to those familiar with the manufacture of such devices, there are a number of theoretical or laboratory type devices which use rather contorted geometries to deal with the problems of making contact to substrates of higher or lower resistivity, but which have not found wide commercial acceptance. By enabling the contacts to be centered with respect to the entire device 23, the invention greatly simplifies the task of mounting the device 23 in a conventional commercial fashion. In particular, if the contacts are positioned off-center, relative to the remainder of a device, mounting the device in a permanent fashion becomes difficult using conventional techniques because of the moment arm created by the non-symmetrical geometry of the device. In contrast, the present invention permits the device to be quickly, easily and conventionally mounted without concern as to whether the device will tilt or otherwise skew because of its substrate and contact geometry.

FIG. 6 further illustrates that in preferred embodiments the ohmic contact 20 to the epitaxial layer 11 is physically and electrically connected to a reflective cup 25, it being understood that the term "cup" refers to any appropriate device of this nature. The cup 25 is formed of a conductive material and the diode device 23 is fastened to the cup 25 using a conductive epoxy 26. With respect to the conductive epoxy 26, the value of the insulating layer 21 becomes more readily apparent as it prevents the conductive epoxy 26 from making electrical contact with the substrate even where the conductive epoxy surrounds the ohmic contact 20, the epitaxial layer 11, the junction 14, and side portions 17 of the diode device 23. Although a number of references indicate that such a diode can be fastened to such a reflective surface using a small dab of epoxy between a respective contact and a surface upon which it is mounted, in reality such devices often represent laboratory prototypes or schematic designs rather than commercial devices. In particular, commercial manufacturing techniques require that a diode be positioned in a more liberal amount of epoxy that should avoid the need for laboratory precision, and to which the epoxy can be added in mass production fashion. For example, in an embodiment such as that shown in FIG. 6, the conductive epoxy 26, if applied in a conventional fashion, will typically spread over a vertical dimension of about 3 mils (0.003 inches). This means that the diode device must be mountable in a 3 mil dimension of conductive epoxy while preventing the contact between the conductive epoxy and the device from causing any sort of short circuit.

It will thus be seen that the insulating layer 21 of the invention prevents any such short circuiting by insulating all of the aforementioned portions of the diode device 23 from the conductive epoxy 26. In particular, it will be noted that when the diode precursors are cut into individual diodes along the lines 22 as described earlier, a small shoulder 27 is formed from the substrate and is covered by the insulating layer 21. FIG. 6 shows that the shoulder 27 additionally helps prevent the conductive epoxy 26 from spreading any further upwardly and contacting the substrate 10.

If desired, an anti-reflective coating can be applied to the exposed surface of the substrate 10, with aluminum oxide ($Al_2O_3$) being one such suitable and preferred coating for silicon carbide.

As discussed earlier, in the preferred embodiment of the invention, the substantially transparent substrate 10 is formed of the 6H polytype of silicon carbide and has a flat interface surface that is inclined more than one degree off axis with respect to a basal plane thereof substantially toward one of the <1120> directions. The first epitaxial layer 13 is preferably also formed of the 6H polytype of silicon carbide and is homoepitaxially deposited on the substrate interface surface and has the same conductivity type as the substrate 10.

It will be further understood, particularly with reference to FIGS. 4 and 5, that the invention further includes the diode precursor wafer broadly designated at 30 in FIG. 5. The wafer 30 is formed of the desired semiconductive material and includes top and bottom surfaces 18 and 19. The precursor wafer further includes the epitaxial layer 11 of the semiconductive material on the one surface of the wafer, illustrated as the top surface 18, in the form of a plurality of individual mesas 15. Each of the epitaxial layer mesas 15 comprises a layer of p-type material and a layer of n-type material 12 and 13 adjacent one another and that form the respective p-n junctions 14 therebetween. An ohmic contact 20 is made to each epitaxial layer mesa 15 and substantially covers each mesa 15 for generating a large injection of carriers across each of the p-n junctions 14 when a current flows through the contact into and through the junction 14. A plurality of grooves 16 are present in the substrate wafer 30 and surround each of the mesas 15 and define side portions 17 of each diode precursor. An insulating layer 21 is present on the wafer 30 and covers the portions of each epitaxial layer mesa 15 not covered by the respective ohmic contacts 20, any portions of the one surface 18 of the wafer 30 that are not covered by the epitaxial layer mesas 15, and the side portions 17 of each of the diode precursors defined by the grooves 16. As described earlier with respect to the method and the individual diodes of the invention, the layer 21 insulates one surface of the wafer, each junction 14 and the side portions 17 from electrical contact other than through the respective ohmic contacts.

In this embodiment, the diode precursor wafer 30 can further comprise an ohmic contact 24 as described earlier to each of the diode precursors whereby any one or more of the diode precursors can be tested while part of the wafer 30 using the circuit defined by the ohmic contact 24 to the wafer, the substrate 10, the epitaxial layer 11 and the ohmic contact 20 to the epitaxial layer. The value and convenience offered by the ability to test multiple devices on a single wafer is well known in the semiconductor industry.

Figure 7:
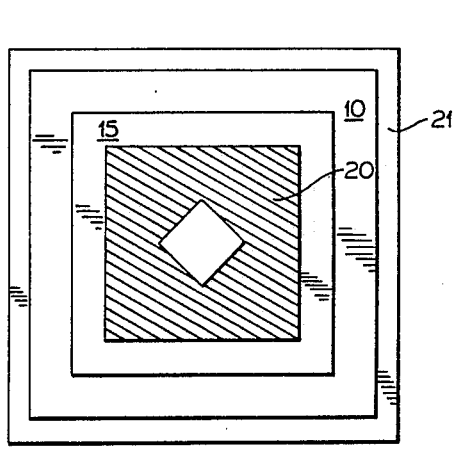
FIG. 7 is a plan view taken along lines 7—7 of FIG. 6.
Figure 8:
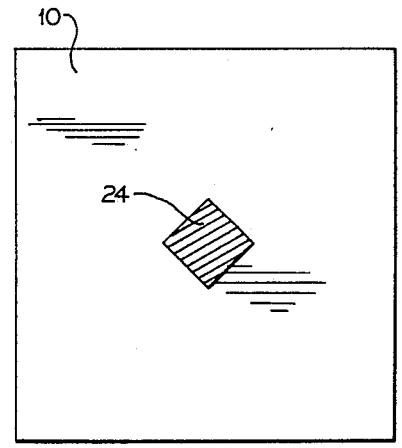
FIG. 8 is a plan view taken along lines 8—8 of FIG. 6.

FIGS. 7 and 8 show some other further features of the diode. FIG. 7 is taken along lines 7—7 of FIG. 6 and is a plan view showing the insulating layer 21, the substrate 10, the mesa 15 and the ohmic contact 20. As stated earlier, because in the preferred embodiment the epitaxial layer 12 is a p+-type layer (i.e. with a carrier concentration greater than the carrier concentration of the n-type epitaxial layer), and because the preferred embodiment uses injection of hole current from layer 12 to layer 13 across junction 14 to produce the light, the substantial resistivity of the p+-type layer 12 makes the use of the large contact 20 desirable. Given this factor, and in the interest of providing as much light as possible, the ohmic contact 20 and the ohmic contact 24 (FIG. 8) are made complimentary in their geometry so that the maximum amount of light will be emitted from the device. In the embodiment illustrated in FIGS. 7 and 8, the ohmic contact 20 is square and has a diamond shaped or oriented opening in the center that corresponds to the diamond shaped or oriented contact 24 on the substrate 10. It will be understood, however, that the particular rectangular designs of the device shown in all of the drawings and particularly illustrated in FIGS. 7 and 8 are merely illustrative of one embodiment, and are not limiting of the geometries for either the substrate, the epitaxial layers or the contacts that can be used in accordance with the present invention.

The invention thus provides a technique for manufacturing a resulting diode that is characterized by a desirable predominant injection of current from a p-type layer to a compensated n-type layer and then through a transparent n-type substrate using the advantages of a large ohmic contact to provide and spread the current. The method further results in a device that can be conventionally mounted using mass production techniques in a straightforward manner rather than a prototype device which would otherwise have little practical application.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method for preparing a plurality of light emitting diodes on a single substrate of a semiconductor material having a p or n conductivity type, and in which the resulting diodes can be separated and mechanically fixed to transmit from their substrate side rather than the junction side using otherwise conventional mounting techniques, and wherein the substrate includes an epitaxial layer of the same semiconductor material on one surface thereof in which the epitaxial layer comprises a layer of p-type material and a layer of n-type material adjacent one another and that form a p-n junction therebetween, the method comprising;

etching the epitaxial layer and the substantially transparent substrate in a predetermined pattern to define individual diode precursors and wherein the etch is deep enough to form mesas in the epitaxial layer that delineate the p-n junctions in each diode precursor from one another;

grooving the substrate from the side of the epitaxial layer and between the mesas of the diode precursors to a predetermined depth into the substrate to define side portions of the device precursors in the substrate while retaining enough of the substrate beneath the grooves to maintain the mechanical stability of the substrate;

adding an ohmic contact to the epitaxial layer;
forming a layer of an insulating material that covers the portions of the epitaxial layer that are not covered by the ohmic contact and that covers any portions of the one surface of the substrate adjacent the mesas that are not covered by the epitaxial layer and that covers portions of the side portions of the substrate for insulating the one surface, the junction and the side portions of the substrate of each diode precursor from electrical contact other than through the ohmic contact; and
adding an ohmic contact to the substrate.

2. A method according to claim 1 further comprising separating the diode precursors into individual diodes by cutting the substrate from the side opposite the epitaxial layer and along positions corresponding to the grooves so that the amount of substrate cut is minimized and the epitaxial layer and the junctions are substantially protected from the mechanical stress of the cutting step.

3. A method according to claim 2 further comprising positioning a separated diode into a reflective cup formed of a conductive material and fastening the diode in the cup with a conductive material and fastening the diode in the cup with a conductive epoxy and with the epitaxial layer adjacent the cup and the substrate facing outwardly from the cup, and with the insulating layer forming an insulating barrier between the conductive epoxy and the epitaxial layer, the substrate, and the junction, so that conductive contact with the epitaxial layers is limited to the ohmic contact and the substrate.

4. A method for preparing a plurality of blue light emitting diodes on a single substrate, and in which the resulting diodes can be separated and mechanically fixed to transmit from their substrate side rather than the junction side using otherwise conventional mounting techniques, the method comprising:
forming an epitaxial layer of alpha silicon carbide on one surface of a substantially transparent silicon carbide substrate having a p or n type conductivity in which the epitaxial layer comprises a layer of p-type silicon carbide and a layer of n-type silicon carbide adjacent one another and that form a p-n junction therebetween;
etching the epitaxial layer and the substrate in a predetermined pattern to define individual diode precursors and wherein the etch is deep enough to form mesas in the epitaxial layer that delineate the p-n junctions in each diode precursor from one another;
grooving the substrate from the side of the epitaxial layer and between the mesas of the diode precursors to a predetermined depth into the substrate to define side portions of the device precursors in the substrate while retaining enough of the substrate beneath the grooves to maintain the mechanical stability of the substrate;
adding an ohmic contact to the epitaxial layer;
forming a layer of an insulating material that covers the portions of the epitaxial layer that are not covered by the ohmic contact and that covers any portions of the one surface of the substrate adjacent the mesas that are not covered by the epitaxial layer and that covers portions of the side portions of the substrate for insulating the one surface, the junction and the side portions of the substrate of each diode precursor from electrical contact other than through the ohmic contact; and
adding an ohmic contact to the substrate.

5. A method according to claim 4 further comprising the step of separating the diode precursors into individual diodes.

6. A method according to claim 5 wherein the step of separating the diode precursors into individual diodes comprises cutting the substrate from the side opposite the epitaxial layer and at positions corresponding to said grooves to avoid mechanical stress upon the epitaxial layer or the junction.

7. A method according to claim 6 and further comprising:
adding an overlay contact to the ohmic contact to the substrate to facilitate wire bonding thereto;
applying a noble metal to the ohmic contact on the epitaxial layer to prevent oxidation of the ohmic contact; and
mounting the separated diodes junction side down in a reflective cup using a conductive epoxy.

8. A method according to claim 7 wherein the step of adding an overlay contact to the ohmic contact to the substrate comprises adding a metal contact selected from the group consisting of aluminum, gold, or silver.

9. A method according to claim 7 wherein the step of applying a noble metal comprises applying a noble metal selected from the group consisting of platinum, palladium, gold, and silver.

10. A method according to claim 4 wherein the step of adding ohmic contacts to the exposed epitaxial layer further comprises selectively etching the oxide to expose the epitaxial to the ohmic contacts.

11. A method according to claim 4 wherein the step of forming an epitaxial layer of alpha silicon carbide on one surface of a silicon carbide substrate comprises forming an epitaxial layer on a wafer of silicon carbide.

12. A method according to claim 4 wherein the step of forming a layer of insulating material comprises thermal oxidation of the grooved epitaxial layer and substrate.

13. A method according to claim 4 wherein the step of adding an ohmic contact to the exposed epitaxial layer comprises adding an aluminum or aluminum alloy contact to the epitaxial layer.

14. A method according to claim 4 wherein the step of forming an epitaxial layer of alpha silicon carbide on one surface of a silicon carbide substrate comprises homoepitaxially depositing a film of an alpha silicon carbide polytype on a prepared surface of an alpha silicon carbide substrate wherein the planar surface is inclined more than one degree off axis with respect to a basal plane thereof substantially towards one of the <1120> directions.

15. A method according to claim 4 wherein the step of forming an epitaxial layer comprises forming an epitaxial layer having an n-type conductivity on a substrate having an n-type conductivity on the n-type epitaxial layer.

16. A method according to claim 15 wherein the step of forming an n-type epitaxial layer comprises forming a compensated n-type epitaxial layer, and the step of forming a p-type epitaxial layer comprises forming a p-type epitaxial layer in which the carrier concentration is greater than the carrier concentration in the n-type epitaxial layer.

* * * * *

UNITED STATES PATENT AND TRADEMARK OFFICE
CERTIFICATE OF CORRECTION

PATENT NO. : 4,966,862
DATED : October 30, 1990
INVENTOR(S) : John A. Edmond It is certified that error appears in the above-identified patent and that said Letters Patent is hereby corrected as shown below:

Column 6, line 11, after the word degree, please insert --off axis with respect to a basal plane thereof substantially--.

Column 11, lines 24-25, please delete "material and fastening the diode in the cup with a conductive".

Column 12, line 58, please insert after the word conductivity --and then forming an epitaxial layer having a p-type conductivity--.

Signed and Sealed this

Twenty-ninth Day of September, 1992

Attest:

DOUGLAS B. COMER

*Attesting Officer*   *Acting Commissioner of Patents and Trademarks*